(12) United States Patent
Gherman et al.

(10) Patent No.: US 9,347,986 B2
(45) Date of Patent: May 24, 2016

(54) METHOD AND DEVICE FOR CONTROLLING THE LATENCY OF ELECTRONIC CIRCUITS

(75) Inventors: Valentin Gherman, Palaiseau (FR); Yannick Bonhomme, Breuillet (FR)

(73) Assignee: Commissariat A L'Energie et Aux Energies Alternatives, Paris (FR)

( * ) Notice: Subject to any disclaimer, the term of this patent is extended or adjusted under 35 U.S.C. 154(b) by 589 days.

(21) Appl. No.: 13/820,554

(22) PCT Filed: Aug. 30, 2011

(86) PCT No.: PCT/EP2011/064888
§ 371 (c)(1),
(2), (4) Date: Apr. 16, 2013

(87) PCT Pub. No.: WO2012/028608
PCT Pub. Date: Mar. 8, 2012

(65) Prior Publication Data
US 2014/0145748 A1    May 29, 2014

(30) Foreign Application Priority Data
Sep. 2, 2010   (FR) ..................................... 10 56968

(51) Int. Cl.
*G01R 31/02*     (2006.01)
*G01R 31/28*     (2006.01)
*G01R 31/30*     (2006.01)
G01R 31/26       (2014.01)
G01R 31/317      (2006.01)

(52) U.S. Cl.
CPC ........ *G01R 31/2856* (2013.01); *G01R 31/2879* (2013.01); *G01R 31/3016* (2013.01); *G01R 31/2642* (2013.01); *G01R 31/31725* (2013.01)

(58) Field of Classification Search
CPC ........... G01R 31/2856; G01R 31/2879; G01R 31/3016
See application file for complete search history.

(56) References Cited

U.S. PATENT DOCUMENTS

2009/0231025 A1*   9/2009   Wang ........................ G05F 1/56
                                                             327/543

OTHER PUBLICATIONS

Wang et al., System-on-Chip Test Architectures: Nanometer Design for Testability, pp. 376-378, 2008.*
Mridul Agarwal, et al., "Circuit Failure Prediction and Its Application to Transistor Aging", 25th IEEE VLSI Test Symmposium, May 1, 2007, pp. 277-286, IEEE, XP031091631.

(Continued)

*Primary Examiner* — Daniel Miller
(74) *Attorney, Agent, or Firm* — Baker & Hostetler LLP

(57) ABSTRACT

A device for monitoring the latency of electronic circuits based on microtechnology and/or nanotechnology, said circuits to be tested being supplied with the aid of a voltage Vdd, having a low level and a high level, for the detection of delay faults of said circuits, comprises: at least one device of type I placed between the high level of the power supply voltage and the elements of the circuit to be tested, and/or at least one device of type II placed between the low level of the power supply voltage of the elements of the elements of said circuit to be tested, the device of type I and the device of type II comprising at least one low-latency electrical path, said low-latency path being connected in parallel with a high-latency electrical path, a test signal monitoring the opening of the low-latency paths while the high-latency electrical paths are open.

11 Claims, 4 Drawing Sheets

(56) References Cited

OTHER PUBLICATIONS

D.J. Kinniment, et al., "On-Chip Structures for Timing Measurement and Test", Microprocessors and Microsystems, Oct. 1, 2003, pp. 473-483, vol. 27, No. 9, Elsevier, XP004453319.

Mridul Agarwal, et al., "Optimized Circuit Failure Prediction for Aging: Practicality and Promise", IEEE International Test Conference, Oct. 28, 2008, pp. 1-10, IEEE, Piscataway, NJ, XP031372401.

* cited by examiner

METHOD AND DEVICE FOR CONTROLLING THE LATENCY OF ELECTRONIC CIRCUITS

CROSS-REFERENCE TO RELATED APPLICATIONS

This application is a National Stage of International patent application PCT/EP2011/064888, filed on Aug. 30, 2011, which claims priority to foreign French patent application No. FR 1056968, filed on Sep. 2, 2010, the disclosures of which are incorporated by reference in their entirety.

FIELD OF THE INVENTION

The invention relates to a method and a device for monitoring the latency of electronic circuits used for example for testing delay faults and related devices which are applied notably to the fields of microtechnologies and nanotechnologies. The invention may be used, for example, for the detection of permanent faults that have appeared in the production phase of circuits or due to the burning-in of the latter.

BACKGROUND

In circuits produced on the basis of microtechnologies and nanotechnologies, the faults resulting from physical defects due to burning-in may cause operating errors and finally the failure of the system. One way of preventing these failures is to mask or to correct the errors. Masking can be carried out for example with the aid of a majority vote on redundant systems, while usually the correction is based on a detection method combined with mechanisms for reconfiguring and reexecuting the faulty operation. Unfortunately, masking and correction have considerable extra costs notably in hardware and in power.

The cost of the "mitigation" of the physical defects due to burning-in may be reduced significantly if it is considered that the majority of these defects show themselves through a progressive increase in the latency of the circuit. Consequently, a less costly approach is to prevent the appearance of the failures by detecting the possible delay faults due to burning-in before they generate errors. One monitoring technique that allows detection by anticipation of these faults consists in testing the systems in "degraded" mode. In the present description, the word "degraded" is defined as being a slight deterioration of the parameters of the circuit during its test, this term being known to those skilled in the art to denote an operating state. For example, the clock frequency of a synchronous circuit may be slightly increased and/or its power supply voltage slightly reduced. This offset between the operating parameters in degraded mode and in normal (nondegraded) mode provides a time margin during which the faults due to burning-in become detectable before causing errors in normal mode. This detection is equivalent to an anticipation of the errors that might appear during the operation of the circuit in normal (nondegraded) mode.

In current circuits, this type of degradation is implemented with the aid of the infrastructure which allows the management of the power supply voltage and the working frequency.

Normally, a system on a chip is divided into several voltage-frequency islands, that is to say that each island has its own hardware infrastructure for the management of its voltage and its frequency. Unfortunately, the size of these islands is relatively large and does not allow testing in degraded mode of certain portions of the circuit which, episodically, are not used, while other portions of the circuit in the same voltage-frequency island execute operative tasks. In addition, the latency with which the power supply voltage and/or the frequency can be changed is relatively low and not suited to the application of the degraded mode.

SUMMARY OF THE INVENTION

The invention relates to a device for monitoring the latency of electronic circuits based on microtechnology and/or nanotechnology, said circuits to be tested being supplied with the aid of a voltage Vdd, having a low level and a high level, for the detection of delay faults of said circuits, characterized in that it comprises in combination at least one of the following elements:
  a device of type I placed between the high level Vdd of the power supply voltage and one or more elements of the circuit to be tested, and/or
  a device of type II placed between the low level Vss of the power supply voltage and one or more elements of said circuit to be tested,
  the device of type I and the device of type II comprising at least one low-latency electrical path, said low-latency path being connected in parallel with a high-latency electrical path R,
  a test signal monitoring the opening of the low-latency paths while the high-latency electrical paths are open.

A degradation device of type I is, for example, inserted between the high level of the power supply voltage and one or more elements of the circuit to be tested and consists of three transistors distributed in the following manner:
  a first transistor offering a low-latency path that is open only when a test signal T is assigned to the low level Vss of the power supply voltage, said first transistor is closed during the test of the circuit in degraded mode and open during operation in nondegraded mode,
  a second transistor that is always open and offering the path characterized by a high latency,
  a third transistor used to generate at its drain $D_{233}$ the voltage that controls the gate $G_{232}$ of the second transistor.

The device comprises, for example, a degradation device of type I inserted between the high level of the power supply voltage and one or more elements of the circuit to be tested consisting:
  of a first transistor offering a low-latency path, said transistor being open only when the monitoring signal T is assigned to the low level Vss of the power supply voltage,
  a second transistor that is always open offering a path characterized by a high latency,
  the drain $D_{332}$ of the transistor being connected to its own gate $G_{332}$.

A degradation device of type I is, for example, inserted between the high level of the power supply voltage and one or more elements of the circuit to be tested comprises:
  a first transistor offering a low-latency path, said first transistor being open only when the monitoring signal (nT) is assigned to the high level Vdd of the power supply voltage,
  a second transistor that is always open and offering a path characterized by a high latency, the gate $G_{432}$ of said transistor being monitored by a signal Vcon having an electrical voltage of intermediate level between the high level and the low level of the power supply voltage.

A degradation device of type II may be inserted between the low level of the power supply voltage and one or more elements of the circuit to be tested comprise:

a first transistor offering a low-latency path that is open only when the monitoring signal (nT) is assigned to the high level Vdd of the power supply voltage, a second transistor that is always open and offering a path characterized by a high latency, a third transistor adapted to generate at its drain $D_{543}$ the voltage that controls the gate $G_{542}$ of the transistor.

The device may comprise a degradation device of type II containing:

a first transistor offering a low-latency path that is open when the monitoring signal (nT) is assigned to the high level Vdd of the power supply voltage, a second transistor that is always open and offering a path characterized by a high latency, the drain $D_{642}$ of the transistor is connected to its own gate $G_{642}$.

The device may comprise a degradation device of type II comprising:

a first transistor offering a low-latency path that is open when the monitoring signal nT is assigned to the high level Vdd of the power supply voltage, a second transistor that is always open and offering a path characterized by a high latency, the gate of the transistor $G_{742}$ is monitored by a signal nVcon, the electrical voltage applied by the signal nVcon having an intermediate level between the high level Vdd and the low level Vss of the power supply voltage.

According to one embodiment, the device consists of a combination in series and/or in parallel of the devices of type I.

According to another embodiment, the device consists of a combination in series and/or in parallel of the devices of type II.

The device is used, for example, for monitoring the latency of the flip-flops contained in the circuit to be tested.

The invention also relates to a method for monitoring the latency of the electronic circuits based on microtechnology and/or nanotechnology, in order to detect faults due to burning-in or to the production phase, characterized in that it uses a device having the features described above.

Apart from the great time and space granularity offered for the choice of the degraded modes, these devices are distinguished by a very low hardware cost measured in number of transistors. Moreover, the same monitoring signals can be used to control the degradation devices of the same type. A simple logic inversion is sufficient to convert the monitoring signals between the degradation devices of type I and II.

BRIEF DESCRIPTION OF THE DRAWINGS

Other features and advantages of the invention will become apparent with the aid of the following description given by way of illustration and being nonlimiting and made with respect to the appended drawings amongst which.

DETAILED DESCRIPTION

One of the ideas of the present invention is to have specific devices, abbreviated to "DCS", either between the elements of the circuit to be tested and the high level of the power supply of said circuit to be tested, or between the elements of the circuit to be tested and the low level of the power supply of said circuit. A characteristic of these devices is notably that they locally and temporarily degrade the latency of electronic circuits which offer at least two operating modes, the degraded modes and the normal modes, having respectively a high and a low latency which depend on the technology of implementation, on the dimensions chosen for the transistors used in the degradation device and on the power supply voltage, it being possible for them to go, for example, from a few picoseconds (virtually zero) to infinity. The high latency is higher than the low latency. The rest of the description will give a number of examples:

on the one hand, of degradation devices of type I which connect elements of the circuit to the high level of the power supply voltage Vdd, on the other hand, of degradation devices of type II which connect elements of the circuit to the low level of the power supply voltage Vdd.

Figure 1:
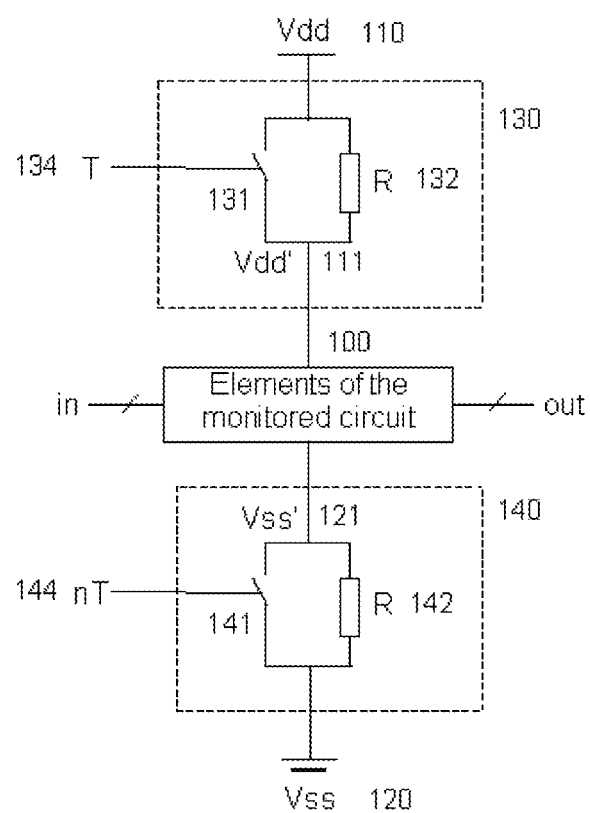
FIG. 1 shows the proposed degradation method with degradation devices according to the invention of type I and II comprising a high-latency path in parallel with a low-latency path that can be selected by a monitoring signal.

FIG. 1 shows an exemplary embodiment of a degradation device and method according to the invention using degradation devices 130 and 140 respectively of type I and II containing a high-latency path in parallel with a low-latency path that can be selected by a monitoring signal. The power supply of the circuit 100 to be tested is shown by the elements Vdd, 110 and Vss, 120 respectively the high level and the low level of the power supply device.

The devices of type I are placed between the high level 110 (Vdd) of the power supply voltage and the elements of the circuit 100 under test or the circuit to be tested. The devices of type II are placed between the low level 120 (Vss) of the power supply voltage and the same or other elements of the circuit 100 under test. The two types of degradation devices contain a low-latency electrical path, 131 and respectively 141, which is connected in parallel with a high-latency electrical path (R), 132 and respectively 142. The opening of the low-latency paths 131 and 141 is monitored by a test signal 134 (T) respectively 144 (nT) while the high-latency electrical paths 132 and 142 are always open. The low-latency paths are closed during the test of the circuit in degraded mode and they are open during operation in nondegraded mode. It is not necessary for both types of degradation devices to be applied to the same elements of the monitored circuit 100.

Figure 2:
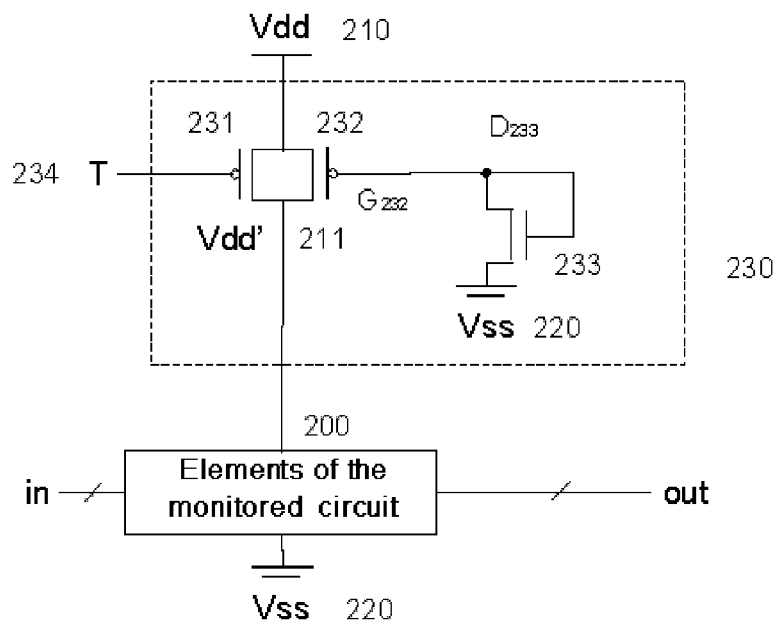
FIG. 2 shows a degradation device of type I in which a first transistor having a gate connected to the drain and to the gate of a second transistor forms a high-latency path.

FIG. 2 shows a degradation device 230 of type I which contains three transistors. The transistor 231 offers a low-latency path which is open only when the monitoring signal 234 (T) is assigned to the low level 220 (Vss) of the power supply voltage. The transistor 231 is closed during the test of the circuit in degraded mode and it is open during operation in nondegraded mode. The transistor 232 is always open and offers a path characterized by a high latency. The transistor 233 is used to generate at its drain $D_{233}$ the voltage that controls the gate $G_{232}$ of the transistor 232. This voltage is degraded, which means that it has an intermediate level between the low level 220 (Vss) of the power supply voltage and the switching voltage of the transistor 232. The degraded voltage induces a high latency of the transistor 232. The device 230 may be inserted between the high level 210 (Vdd) of the power supply voltage and one or more elements of the circuit 200 to be tested (of the standard cells for example) which are linked to the node 211 (Vdd') instead of the node 210 (Vdd).

Figure 3:
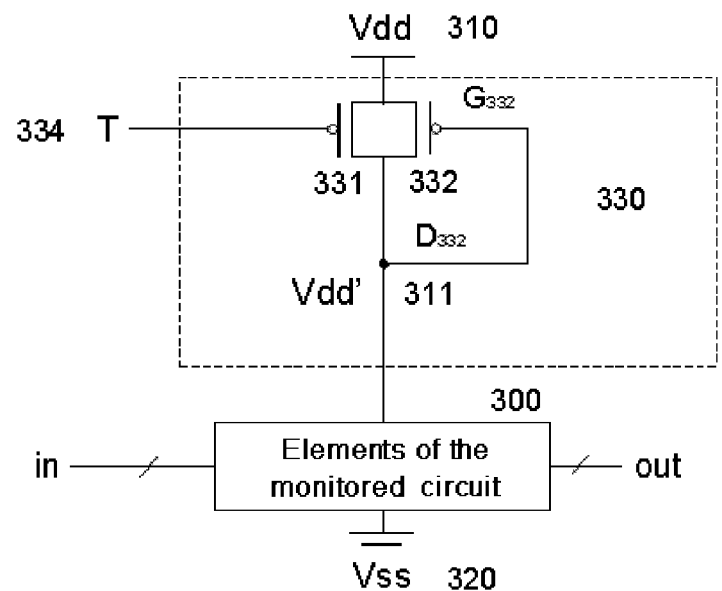
FIG. 3 shows a degradation device of type I in which the high-latency path comprises a transistor having its gate connected to its drain.

FIG. 3 shows a degradation device 330 of type I which contains two transistors. The transistor 331 offers a low-latency path which is open only when the monitoring signal 334 (T) is assigned to the low level 320 (Vss) of the power supply voltage. The transistor 331 is closed during the test of the circuit in degraded mode and it is open during operation in nondegraded mode. The transistor 332 is always open and offers a path characterized by a high latency. The drain $D_{332}$ of the transistor 332 is connected to its own gate $G_{332}$. Consequently, the voltage that controls the gate of the transistor 332 is degraded, which means that it has an intermediate level between the low level 320 (Vss) of the power supply voltage and the switching voltage of the transistor 332. This degraded voltage induces a high latency of the transistor 332. The device 330 may be inserted between the high level 310 (Vdd) of the power supply voltage and one or more elements of the circuit 300 under test (standard cells for example) which are connected to the node 311 (Vdd') instead of the node 310 (Vdd).

Figure 4:
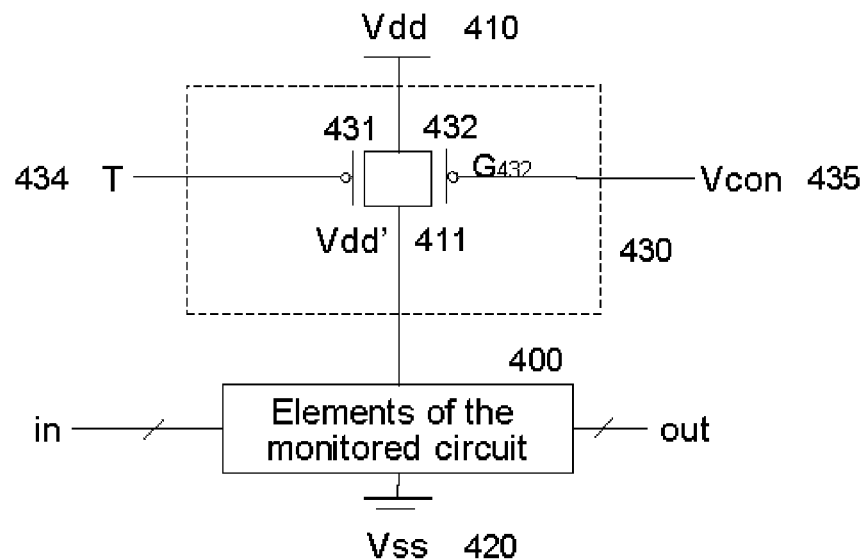
FIG. 4 shows a degradation device of type II in which the high-latency path comprises a transistor having a gate monitored by a signal allowing the application of an electrical voltage with an intermediate level between the high and low levels of the power supply voltage of the circuit to be tested.

FIG. 4 show a degradation device 430 of type I which contains two transistors 431, 432. The transistor 431 offers a low-latency path which is open only when the monitoring signal 434 (T) is assigned to the low level 420 (Vss) of the power supply voltage. The transistor 431 is closed during the test of the circuit in degraded mode and it is open during operation in normal (nondegraded) mode. The transistor 432 is always open and offers a path characterized by a high latency. The gate $G_{432}$ of the transistor 432 is monitored by a signal Vcon (435). The electrical voltage applied by the signal Vcon (435) has an intermediate level between the low level 420 (Vss) of the power supply voltage and the switching voltage of the transistor 432. This intermediate level allows a fine monitoring of the latency of the transistor 432 and can be chosen during a process of characterization of the circuits to be tested or of the technology used for the production of these circuits. The device 430 may be inserted between the high level 410 (Vdd) of the power supply voltage and one or more elements of the circuit 400 under test (standard cells for example) which are connected to the node 411 (Vdd') instead of the node 410 (Vdd).

Figure 5:
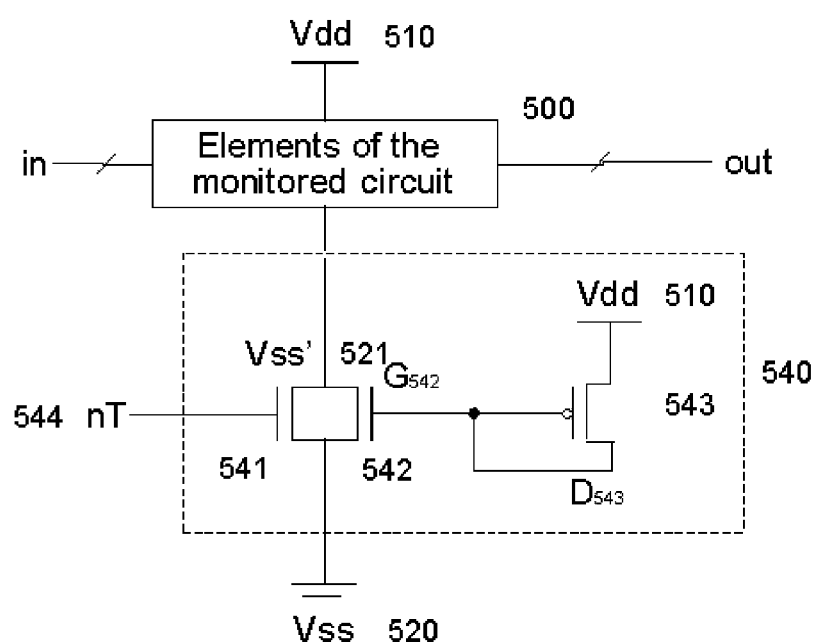
FIG. 5 shows a degradation device of type II in which the high-latency path comprises a transistor of which the gate is connected to the drain and to the gate of another transistor, FIG. 6, an example of a degradation device of type II, in which the high-latency path comprises a transistor in which the gate is connected to its drain, and FIG. 7, an example of a degradation device of type II in which the high-latency path comprises a transistor of which the gate is monitored by a signal which allows the application of an electrical voltage with an intermediate level between the high and low levels of the power supply voltage of the circuit to be tested.

FIG. 5 shows a degradation device 540 of type II which contains three transistors 541, 542, 543. The transistor 541 offers a low-latency path which is open only when a monitoring signal 544 (nT) is assigned to the high level 510 (Vdd) of the power supply voltage. The transistor 541 is closed during the test of the circuit in degraded mode and it is open during operation in nondegraded mode. The transistor 542 is always open and offers a path characterized by a high latency. The transistor 543 is used to generate at its drain $D_{543}$ the voltage that controls the gate $G_{542}$ of the transistor 542. This voltage is degraded, which means that it has an intermediate level between the high level 510 (Vdd) of the power supply voltage and the switching voltage of the transistor 542. This degraded voltage induces a high latency of the transistor 542. The device 540 may be inserted between the low level 520 (Vss) of the power supply voltage and one or more elements of the circuit 500 under test (standard cells for example) which are connected to the node 521 (Vss') instead of the node 520 (Vss).

Figure 6:
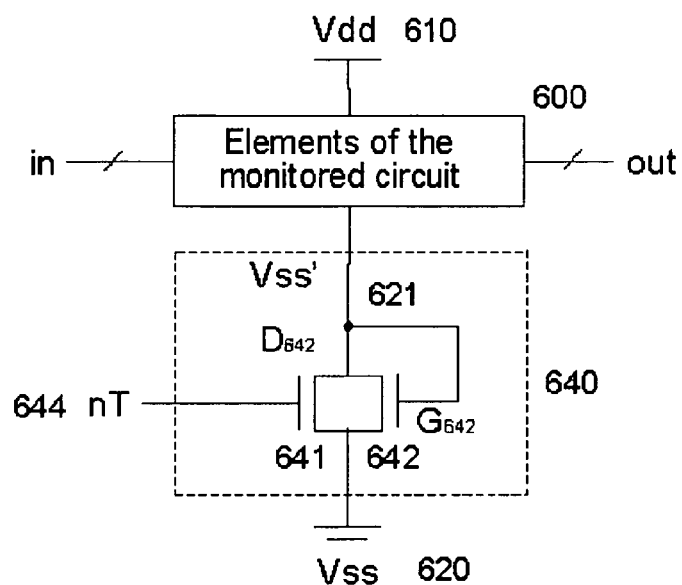

FIG. 6 shows a degradation device 640 of type II which contains two transistors. The transistor 641 offers a low-latency path which is open only when the monitoring signal 644 (nT) is assigned to the high level 610 (Vdd) of the power supply voltage. The transistor 641 is closed during the test of the circuit in degraded mode and it is open during operation in nondegraded mode. The transistor 642 is always open and offers a path characterized by a high latency. The drain $D_{642}$ of the transistor 642 is connected to its own gate $G_{642}$. Consequently, the voltage that controls the gate $G_{642}$ of the transistor 642 is degraded, which means that it has an intermediate level between the high level 610 (Vdd) of the power supply voltage and the switching voltage of the transistor 642. This degraded voltage induces a high latency of the transistor 642. The device 640 may be inserted between the low level 620 (Vss) of the power supply voltage and one or more elements of the circuit 600 under test (standard cells for example) which are connected to the node 621 (Vss') instead of the node 620 (Vss).

Figure 7:
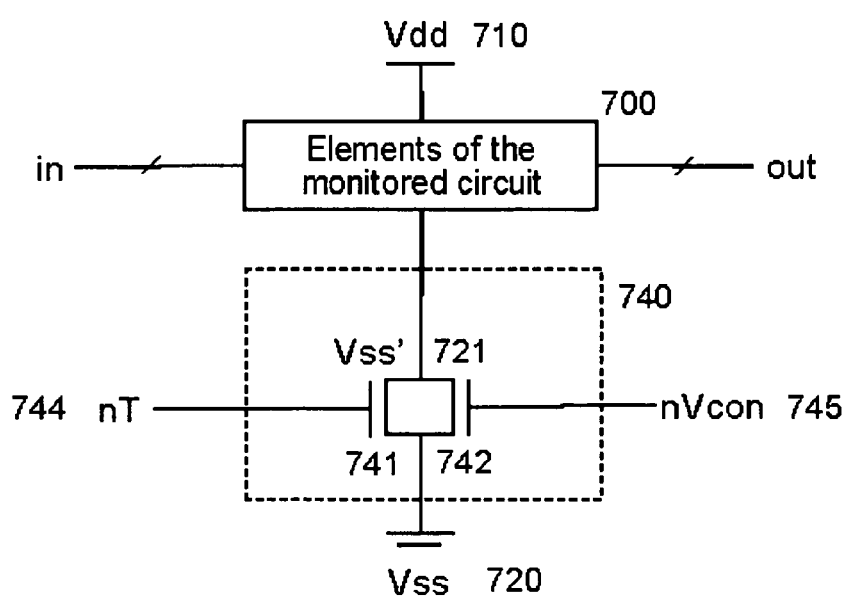

FIG. 7 shows a degradation device 740 of type II which contains two transistors. The transistor 741 offers a low-latency path which is open only when the monitoring signal 744 (nT) is assigned to the high level 710 (Vdd) of the power supply voltage. The transistor 741 is closed during the test of the circuit in degraded mode and it is open during operation in normal (nondegraded) mode. The transistor 742 is always open and offers a path characterized by a high latency. The gate $G_{742}$ of the transistor 742 is monitored by a signal nVcon (745). The electrical voltage applied by the signal nVcon (745) has an intermediate level between the high level 710 (Vdd) of the power supply voltage and the switching voltage of the transistor 742. This intermediate level allows a fine monitoring of the latency of the transistor 742 and can be chosen during a process of characterization of the circuits to be tested or of the technology used for the production of these circuits. The device 740 may be inserted between the low level 720 (Vss) of the power supply voltage and one or more elements of the circuit 700 under test (standard cells for example) which are connected to the node 721 (Vss') instead of the node 720 (Vss).

If the degradation devices 230, 330, 430, 540, 640 or 740 are chosen only for their large time and space granularities, as in the case of the concurrent online test, they may be applied only to the flip-flops (or "latches") of the circuit under test. On the other hand, if these devices are used only for their intrinsic degradation characteristics, that is to say acting on the impedance of the circuit under test, it is preferable that these devices affect all the elements of the circuit. The last case concerns the noncurrent tests such as the production test to filter the circuits with defects of youth and the periodic tests used for monitoring the systems in their operating environments.

The devices of the same degradation type (I or II) may be combined in series or in parallel to monitor the latency of electronic circuits for the delay fault test. The same monitoring signals may be used to choose the latency of the devices that produce the same type of degradation (I or II) and must be applied to the same type of test (concurrent or nonconcurrent). A simple logic inversion (nT=not T) is sufficient to convert the monitoring signals between the degradation devices of type I and II.

The method and the device according to the invention offer great time and space granularity in the choice of the circuits that can be tested in degraded mode in concurrent manner, that is to say in parallel with the normal operation of the rest of the system. One of the objectives of the present patent application is to be able to test more frequently in degraded mode the circuits that are not used during certain time periods. The idea is to insert special structures with a monitorable latency between the points of the electrical power supply network and the whole or a part of the elements of the circuits under test as has been described. The high latencies are chosen for the degraded modes while the low latencies are chosen during the normal (nondegraded) operating modes.

Another advantage of this method and of the associated device is that they offer a new manner of proceeding that can be used during the nonconcurrent tests of the circuit when the time and space granularities of the degradation are not critical, such as for example during the production tests or the periodic tests used for monitoring the circuits in their operating environments. Normally, after they have been produced, the circuits are stressed by making them work at voltages and temperatures higher than those intended for their normal operation. This type of stress is known as "burn-in". An alternative to burn-in is the test at a power supply voltage that is lower than the normal operating voltage. This can be seen as a form of degradation. With the present invention, another form of degradation becomes possible which is complementary to the lowering of the power supply voltage. This form of degradation is characterized by a local increase in the impedance and a limiting of the power supply current of the elements of the circuit connected to the devices proposed and described hereinafter.

The invention claimed is:

1. A device for monitoring a latency of electronic circuits based on microtechnology, nanotechnology, or both, the device comprising:
   electronic circuits to be tested being supplied with a power supply voltage, having a low level and a high level, for a detection of delay faults of said electronic circuits,
   a degradation device of type I placed between the high level of the power supply voltage and one or more elements of an electronic circuit among the electronic circuits to be tested,
   a degradation device of type II placed between the low level of the power supply voltage and one or more elements of said electronic circuit to be tested,
   the device of type I and the device of type II each comprising at least one low-latency electrical path, said low-latency electrical path being connected in parallel with a high-latency electrical path, said low-latency path causing a low latency operation of the electronic circuit when the power supply voltage is not degraded, and said high-latency path causing a high-latency operation of the electronic circuit when the power supply voltage is degraded, and
   the low-latency electrical paths being conductive when receiving a test signal while the high-latency electrical paths are always conductive.

2. The device as claimed in claim 1, wherein the degradation device of type I that is inserted between the high level of the power supply voltage and one or more elements of the electronic circuit to be tested includes three transistors distributed in the following manner:
   a first transistor offering the low-latency path that is conductive only when the test signal is assigned to the low level of the power supply voltage, said first transistor is closed during the test of the circuit in a degraded mode and open during operation in nondegraded mode,
   a second transistor that is always open to form the high-latency path, and
   a third transistor used to generate at a drain, a drain voltage that controls a gate of the second transistor.

3. The device as claimed in claim 1, further comprising:
   another degradation device of type I inserted between the high level of the power supply voltage and one or more elements of the electronic circuit to be tested, the another degradation device of type I including:
   a first transistor offering another low-latency path, said first transistor being conductive only when the test signal is assigned to the low level of the power supply voltage,
   a second transistor that is always conductive offering another high latency path,
   a drain of the second transistor being connected to a gate of the second transistor.

4. The device as claimed in claim 1, wherein the degradation device of type I inserted between the high level of the power supply voltage and one or more elements of the electronic circuit to be tested comprises:
   a first transistor offering a low-latency path, said first transistor being conductive only when the test signal is assigned to the high level of the power supply voltage,
   a second transistor that is always conductive and offering another high latency path, a gate of said second transistor being monitored by a signal Vcon having an electrical voltage of intermediate level between the high level and the low level of the power supply voltage.

5. The device as claimed in claim 1, wherein the degradation device of type II inserted between the low level of the power supply voltage and one or more elements of the electronic circuit to be tested comprises:
   a first transistor offering a low-latency path that is conductive only when the test signal is assigned to the high level of the power supply voltage,
   a second transistor that is always conductive and offering another high latency path,
   a third transistor adapted to generate at a drain of the third transistor, a voltage that controls a gate of the third transistor.

6. The device as claimed in claim 1, further comprising another degradation device of type II containing:
   a first transistor offering a low-latency path that is conductive when the test signal is assigned to the high level of the power supply voltage,
   a second transistor that is always conductive and offering another high latency path, a drain of the second transistor is connected to a gate of the second gate.

7. The device as claimed in claim 1, further comprising another degradation device of type II comprising:
   a first transistor offering a low-latency path that is conductive when the test signal is assigned to the high level of the power supply voltage,
   a second transistor that is always conductive and offering another high latency path, a gate of the second transistor is monitored by a signal nVcon, an electrical voltage applied by the signal nVcon having an intermediate level between the high level and the low level of the power supply voltage.

8. The device as claimed in claim 2, further comprising a combination in series and/or in parallel of at least two degradation devices identical to the degradation device of type I, said at least two degradation devices including the degradation device of type I.

9. The device as claimed in claim 5, further comprising a combination in series and/or in parallel of at least two degradation devices identical to the degradation device of type II, said at least two degradation devices including the degradation device of type II.

10. The device as claimed in claim 1, wherein the device is configured to monitor a latency of flip-flops contained in the electronic circuit to be tested.

11. A method for monitoring a latency of electronic circuits based on microtechnology, nanotechnology, or both, the method comprising:
   detecting faults due to burning in or due to a production phase of the device by:
      supplying to electronic circuits a power supply voltage, having a low level and a high level, for a detection of delay faults of said electronic circuits,
      placing a degradation device of type I between the high level of the power supply voltage and one or more elements of an electronic circuit among the electronic circuits to be tested, and
      placing a degradation device of type II between the low level of the power supply voltage and one or more elements of said electronic circuit to be tested,
   the device of type I and the device of type II each comprising at least one low-latency electrical path, said low-latency electrical path being connected in parallel with a high-latency electrical path, said low-latency path causing a low latency operation of the electronic circuit when the power supply voltage is not degraded, and said high-latency path causing a high-latency operation of the electronic circuit when the power supply voltage is degraded, and
   the low-latency electrical paths being conductive when receiving a test signal while the high-latency electrical paths are always conductive.

\* \* \* \* \*